United States Patent
Laaksonen et al.

(10) Patent No.: US 9,620,727 B2
(45) Date of Patent: Apr. 11, 2017

(54) GRAPHENE-CONTAINING PLATELETS AND ELECTRONIC DEVICES, AND METHOD OF EXFOLIATING GRAPHENE

(75) Inventors: Päivi Laaksonen, Espoo (FI); Jouni Ahopelto, Espoo (FI); Markus Linder, Espoo (FI)

(73) Assignee: Teknologian Tutkimuskeskus VTT (FI)

( * ) Notice: Subject to any disclaimer, the term of this patent is extended or adjusted under 35 U.S.C. 154(b) by 1193 days.

(21) Appl. No.: 13/203,481

(22) PCT Filed: Feb. 25, 2010

(86) PCT No.: PCT/FI2010/050142
§ 371 (c)(1),
(2), (4) Date: Nov. 9, 2011

(87) PCT Pub. No.: WO2010/097517
PCT Pub. Date: Sep. 2, 2010

(65) Prior Publication Data
US 2012/0052301 A1    Mar. 1, 2012

(30) Foreign Application Priority Data
Feb. 26, 2009   (FI) .................................... 20095191

(51) Int. Cl.
*B32B 9/00* (2006.01)
*H01L 51/05* (2006.01)
(Continued)

(52) U.S. Cl.
CPC .......... *H01L 51/0516* (2013.01); *B82Y 10/00* (2013.01); *B82Y 30/00* (2013.01); *B82Y 40/00* (2013.01); *C01B 31/0438* (2013.01); *C01B 31/0469* (2013.01); *C01B 31/0484* (2013.01); *H01L 29/1606* (2013.01); *H01L 51/0093* (2013.01); *C01B 2204/04* (2013.01);
(Continued)

(58) Field of Classification Search
CPC ............. C01B 31/0438; C01B 2204/00; Y10T 428/408
USPC ........................................ 428/408; 423/447.1
See application file for complete search history.

(56) References Cited

U.S. PATENT DOCUMENTS

2006/0014203 A1* 1/2006 Watanabe et al. ................ 435/6
2006/0231792 A1* 10/2006 Drzal et al. .............. 252/188.28
(Continued)

FOREIGN PATENT DOCUMENTS

| FR | 2929619 | 10/2009 |
|---|---|---|
| WO | WO2007047084 | 4/2007 |
| WO | WO2007097938 | 8/2007 |

OTHER PUBLICATIONS

Asuri, P. et al. Enhanced Stability of Enzymes Adsorbed onto Nanoparticles. J. Nanosci. Nanotechnol. 2007, vol. 7.
(Continued)

*Primary Examiner* — Daniel H Miller

(57) ABSTRACT

This document describes graphene-containing platelets and methods of exfoliating graphene from a surface. The method comprises facilitating exfoliation by treatment with proteins. In an embodiment, the proteins adhere to the surface of graphene and then the produced platelets may contain a graphene layer and a protein layer on the surface of the graphene layer. Electronic devices containing such platelets are also described.

23 Claims, 6 Drawing Sheets

2 nm

(51) Int. Cl.
*C01B 31/04* (2006.01)
*B82Y 10/00* (2011.01)
*B82Y 30/00* (2011.01)
*B82Y 40/00* (2011.01)
*H01L 29/16* (2006.01)
*H01L 51/00* (2006.01)

(52) U.S. Cl.
CPC ......... *C01B 2204/32* (2013.01); *Y10T 428/30* (2015.01); *Y10T 428/31938* (2015.04)

(56) References Cited

U.S. PATENT DOCUMENTS

| | | | |
|---|---|---|---|
| 2007/0092432 A1* | 4/2007 | Prud'Homme et al. | 423/448 |
| 2007/0158618 A1 | 7/2007 | Song et al. | |
| 2008/0206124 A1 | 8/2008 | Jang et al. | |
| 2008/0248275 A1 | 10/2008 | Jang et al. | |
| 2008/0258359 A1 | 10/2008 | Zhamu et al. | |
| 2008/0279756 A1 | 11/2008 | Zhamu et al. | |

OTHER PUBLICATIONS

Elliot, M. and Talbot, N.J, Building filaments in the air: aerial morphogenesis in bacteria and fungi, Current opinion in microbiology 2004, 7: 594-601.
Finnish Search Report of Sep. 23, 2009.
Kershaw, M and Talbot, N.J., Hydrophobins and Repellents: Proteins with Fundamental Roles in Fungal Morphogenesis, Fungal Genetics and Biology, 23, 18-33, 1998.
Liang Xiaogan et al: "Graphene Transistors Fabricated via Transfer-Printing in Device Active-Areas on Large Wafer", Oct. 5, 2007.
Linder et al. Hydrophobins: the protein-amphiphiles of filamentous fungi, FEMS Microbiology Reviews, 29, 877-896, 2005.
Lotya, M. et al. Liquid Phase Production of Graphene by Exfoliation of Graphite in Surfactant/Water Solutions. Journal of the American Chemical Society 2009, vol. 131.
Lu, J. et al. Simple Fabrication of a Highly Sensitive Glucose Biosensor Using Enzymes . . . Chem. Mater. 2007, vol. 19.
Mohanty, N. et al. Graphene-Based Single-Bacterium Resolution Biodevice and DNA Transistor. Nano Letters 2008, vol. 8.
Novoselov K S et al. "Electric field effect in atomically thin carbon films", Science, American Ass. for the Advancement of Science, . . . vol. 3061, No. 5696, Oct. 11, 2004.
Schniepp H C et al: "Functionalized single graphene sheets derived from splitting graphite oxide", Journal of Physical Chemistry Part B: . . . vol. 110, No. 17, May 4, 2006.
Szilway, G. R. et al. Self-Assembled Hydrophobin Films at the Air-Water Interface. Biochemistry 2007, vol. 46.
Wang G et al: Synthesis and characterisation of hydrophilic and organophilic graphene nanosheets.
Yau Siu-Tung et al. "A prototype single protein field-effect transistor", Applied physics letters, AIP, American Inst. of Physics, . . . vol. 86, No. 10, Mar. 3, 2005.
Zhao Z-X et al."Amperometric glucose biosensor based on self-assembly hydrophobin with high efficiency of enzyme utilization".

* cited by examiner

GRAPHENE-CONTAINING PLATELETS AND ELECTRONIC DEVICES, AND METHOD OF EXFOLIATING GRAPHENE

TECHNICAL FIELD

The present invention relates generally to methods for producing graphene materials. The present invention relates also to materials that contain graphene.

Furthermore, the present invention relates also to applications of such graphene containing materials. One particular application area is electronic devices.

BACKGROUND ART

Properties and production methods of graphene have been under extensive study for several years. Graphene has unique electrical properties, e.g. high charge carrier mobility etc., which are ultimately promising for electronic applications. Graphene has also promising mechanical properties and therefore has been suggested for several applications on the basis of its strength or lubricative properties as well. Particles of graphene are commonly called graphene platelets, and these can be used as part of other materials or electronic devices, for instance.

Several methods for producing graphene materials have been proposed in the background art. As graphene is naturally present in graphite, several of the proposed methods produce graphene by exfoliating from graphite. Other suggested production methods include deposition of graphene on surfaces.

U.S. Patent Application Publication No. US 2007/0158618 A1 discloses a nano-composite material comprising nano-scaled graphene platelets dispersed in a matrix material. Each of the platelets comprises a sheet of graphite plane or multiple sheets of graphite plane. According to the publications, the platelets are useful for fuel cell and battery applications and can also be used in automotive friction plates and aircraft brake components.

U.S. Patent Application Publication No. US 2008/0248275 A1 discloses a nano-scaled graphene article comprising a non-woven aggregate of nano-scaled graphene platelets. According to the publications, the articles can be used for thermal management in micro-electronic devices and for current-dissipating on an aircraft skin against lightning strikes.

Liang, X et al. Graphene Transistors Fabricated via Transfer-Printing in Device Active-Areas on Large Wafer, Nano Letters, Vol. 7, No. 12, 3840-3844, 2007, discloses a method that uses pillars on a stamp to cut and exfoliate graphene islands from graphite and then uses transfer printing to place the islands from the stamp into device active-areas on a substrate. The publication also reports transistors fabricated from the printed graphene.

U.S. Patent Application Publications No. US 2008/0206124 A1 and US 2008/0258359 A1 disclose providing a graphite intercalation compound comprising a layered graphite containing expandable species residing in an interlayer space of the layered graphite Then, the method comprises exposing the graphite intercalation compound to an exfoliation temperature to at least partially exfoliate the layered graphite.

U.S. Patent Application Publication No. US 2008/0279756 A1 discloses a method of exfoliating a layered material (e.g., graphite and graphite oxide) to produce nano-scaled platelets. The method comprises dispersing graphite or graphite oxide particles in a liquid medium containing therein a surfactant or dispersing agent to obtain a suspension or slurry, and exposing the suspension or slurry to ultrasonic waves (ultrasonication) to produce the separated nano-scaled platelets.

International Patent Application Publication No. WO 2007/097938 A1 discloses graphene layers epitaxially grown on single crystal substrates. A produced device comprises a single crystal region that is substantially lattice-matched to graphene. A graphene layer is deposited on the lattice-matched region by means of molecular beam epitaxy (MBE), for instance.

DISCLOSURE OF INVENTION

In view of the great potential of graphene as a constituent in various devices and materials, there remains need for new production methods with their associated advantages.

Therefore, it is an object of the present invention to provide a new method for producing graphene-containing platelets.

According to an aspect of the invention, the production method comprises facilitating exfoliation of a graphene layer from a surface by treatment with proteins.

In an embodiment, the proteins form a layer on, and attached to, the surface of the graphene.

Thus, according to another aspect of the invention, there is also provided a platelet containing a graphene layer and a protein layer on the surface of said graphene layer.

Therefore, the invention provides new methods for producing graphene-containing platelets, and also totally new types of graphene-containing platelets.

The invention also has several embodiments that may provide certain advantages over the previously known methods and platelets, at least in view of some particular applications.

For example, some embodiments of the production method facilitate exfoliation of graphene to the extent that it is possible to perform exfoliation even at temperatures below 100° C. Thus, a higher quality of the produced graphene may be achieved that by the methods using high temperatures, as in high temperatures the graphene is vulnerable to oxidation or other damage. Lower temperatures are also safer for the operator personnel and do not set so strict requirements for the design of the production equipment.

Some embodiments provide a stable protein layer on the surface of the graphene layer. In these embodiments, the graphene is supported or protected by the proteins, which is beneficial in some applications.

In embodiments, wherein the surface of the graphene layer is provided with functionalized proteins, the proteins may be used, for example, to deliver the platelets to desired sites or connecting the graphene electrically to an external circuitry. Some of these embodiments also allow the use of biomolecular recognition for placing the nanomaterial at specific and desired positions. Thus, there are also embodiments wherein the platelets form structural parts of electronic devices.

In applications wherein the nano-scaled platelets are used as filler components in nanocomposite materials, the cost of the filler can be a very important factor. Therefore, efficient ways of processing and producing carbon nanomaterials are needed. For this it is advantageous that the process is efficient in energy, i.e. that the process does not require high temperatures or input of energy. It is also advantageous that the process can be carried out using solvents such as water, thereby reducing environmental burden and decreasing costs. It is also advantageous that materials used can be produced from renewable natural resources as exemplified by proteins that are produced by biotechnical means. The present invention provides also such embodiments that are capable of meeting these needs.

The invention has also several other embodiments providing associated advantages.

BRIEF DESCRIPTION OF DRAWINGS

For a more complete understanding of the present invention and the advantages thereof, the invention is now described with the aid of the examples and with reference to the following drawings, in which.

DEFINITIONS

Figure 1:
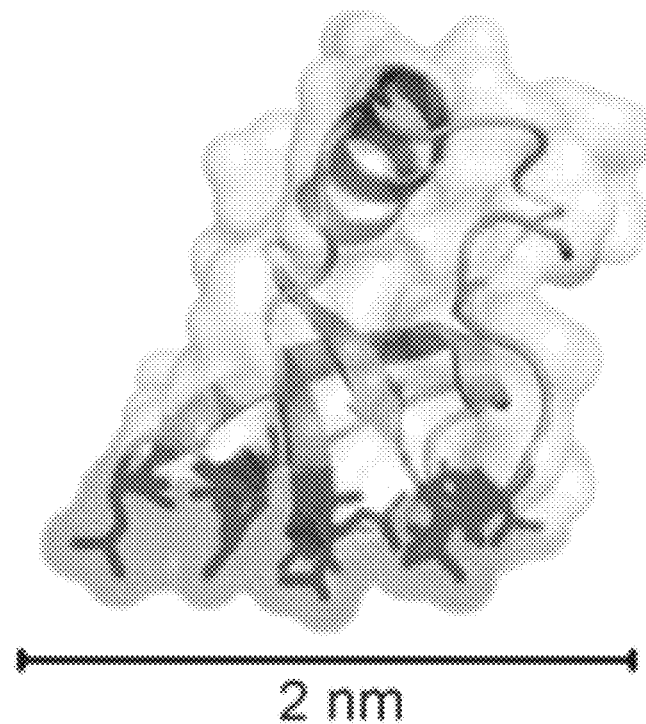
FIG. 1 presents the structure of one protein that can be used according to an embodiment, namely a HFBI protein.

Graphene refers generally to material that consists essentially of a one-atom-thick planar sheet of $sp^2$-bonded carbon atoms. In graphene, the carbon atoms are densely packed in a honeycomb crystal lattice.

Graphene sheet has a similar meaning as graphene but it is used when referring to the sheet-like nature of the graphene material, especially when describing a thickness of an object.

Graphene layer is material that contains graphene and exhibits the functional properties of graphene as relevant for the application in question. Therefore, a graphene layer contains at least one graphene sheet. A graphene layer can contain a plurality of graphene sheets on top of each other, and therefore can have a thickness of several atomic layers.

Layer of graphene is the same as graphene layer.

Platelet is a generally planar film-like object of typically small size and thickness. Size and thickness may be in the order of micrometers or nanometres, for instance.

Protein is a polypeptide molecule comprising a chain of amino acids joined together by peptide bonds.

Modes For Carrying Out The Invention

According to an embodiment, graphene-containing platelets are produced by exfoliating a graphene layer from a surface. The surface can be any surface containing the graphene layer to be exfoliated. The surface may be, for example, a surface of a graphite object or particle. In case the surface forms part of a highly oriented graphite body, the surface can repeatedly produce exfoliated graphene layers. Also the size or area of the produced graphene-containing platelets can be relative large as the domain size is typically high in highly oriented graphite. In case highly oriented pyrolytic graphite (HOPG) of highest quality is used (ZYA grade), domain sizes may be up to 10 $\mu m^2$, thus allowing fabrication of graphene-containing platelets in the corresponding size range.

The surface can also be formed by ordinary graphite or graphite powder. Embodiments using such graphite particles can provide cheaper platelets that can be used in embodiments wherein the domain size and quality of the graphene is not so critical. Applications that may be contemplated for such embodiments include using platelets in composite materials, for example, as reinforcing components.

The surface can also be a non-carbon surface on which a graphene layer or graphene layers have been manufactured by means a deposition method. CVD, ALD, MBE and other such methods as known in the art can be used. For example, the above-referred patent application publication WO 2007/097938 A1 discloses graphene layers epitaxially grown on single crystal substrates.

In other words, the surface from which the graphene layer or graphene layers are exfoliated contains at least one one-atom-thick graphene sheet, but it can be formed by an object that contains a plurality of graphene sheets, or even a body of graphite.

In the embodiment, exfoliation is facilitated by treatment with proteins. The treatment can comprise bringing the proteins and the surface into contact by any suitable means.

The proteins may be natural proteins from fungi, for instance, or any modified or synthetically produced polypeptide that is functionally equivalent to proteins in achieving the desired effect, i.e. the facilitation of exfoliation of graphene. The proteins may also be fusion proteins. The protein may also be contained in a larger structural unit comprising another part or parts attached to the protein.

It is presently contemplated that the demonstrated function of the proteins is based on adhesive forces created between the graphene and the proteins. However, the exact mechanisms are not yet known, and the above assumption may prove inaccurate in later studies. However, based on the above hypothesis, it is presently believed that the adhesive forces tend to separate the outermost graphene sheet or graphene sheets from the surface from which they are exfoliated. The interaction between the proteins and the surface of the graphene layer may be contemplated to facilitate exfoliation even without firm binding of the proteins on the surface of the graphene. Proteins are also typically large compared to the thickness of a graphene sheet and can therefore effectively deliver forces to the graphene sheets. Such forces influencing the proteins, and thereby also the graphene, may be induced by acoustic or mechanical energy, for instance. Examples of acoustic or mechanical energy include energy present in ultrasonic waves and in such movement as caused by shaking and mixing and in a flow of liquid. Thus, in order to facilitate exfoliation, it is possible to use ultrasonication, which means exposing the surface to ultrasonic waves.

According to an embodiment, the proteins include proteins that contain a part that is more hydrophobic than the rest of the protein's body. In another embodiment, the proteins are proteins that have a hydrophobic part that is capable of adhering to the surface of graphene. According to a further embodiment, proteins include amphiphilic proteins. Examples of such hydrophobic and amphiphilic proteins include hydrophobins. Also other proteins can exhibit such properties. Such proteins include rodlins, chaplins, repellants, and SapB as for example described in Elliot, M. and Talbot, N.J, Building filaments in the air: aerial morphogenesis in bacteria and fungi, Current opinion in microbiology 2004, 7: 594-601, and Kershaw, M and Talbot, N.J., Hydrophobins and Repellents: Proteins with Fundamental Roles in Fungal Morphogenesis, Fungal Genetics and Biology, 23, 18-33, 1998.

In some particular embodiments, the proteins include hydrophobins. Examples of hydrophobins include HFBI, HFBII, HFBIII, SRHI, SC3, HGFI and other polypeptides that have resemblance in properties or sequence to said polypeptides. Examples of hydrophobins include therefore also other similar polypeptides which have corresponding properties.

One group of hydrophobins are hydrophobins identified from their amino acid sequence by the content and order of Cys residues, which take the form: Y-C(1)-X-C(2)-C(3)-X-C(4)-X-C(5)-XC(6)-C(7)-X-C(8)-Y where X denotes a sequence of more than one amino acid residue, but typically less than one hundred amino acid residues. Y denotes a sequence, which can be variable in length, consisting of any number of amino acid residues or can even be deleted completely. C denotes a Cys residue where C(2) and C(3) typically follow each other in sequence and C(6) and C(7) also typically follow each other directly in sequence.

According to an embodiment, hydrophobins include polypeptides comprising amino acid sequences, which have, for example, at least 40% similarity at the amino acid sequence level to the mentioned hydrophobins HFBI, HFBII, HFBIII, SRHI, SC3 and HGFI. The level of similarity can of course be also higher, such as at least 50%, at least 60%, at least 80%, or at least 90%.

Typical examples of hydrophobins and their structure and properties are described in Linder et al. Hydrophobins: the protein-amphiphiles of filamentous fungi, FEMS Microbiology Reviews, 29, 877-896, 2005.

In nature, hydrophobins have been found as are amphiphilic proteins produced by filamentous fungi. However, recombinant DNA technologies allow the production in a variety of other organisms such as bacteria, archea, yeasts, plant cells, or other higher eucaryotes. Hydrohophobins may also be produced without the use of living cells, either by synthesis or be cell-free production methods. In addition to adhesive property, these hydrophobins have also some further useful properties that can be utilized in some embodiments. For example, hydrophobins of this type are typically able to form protein films, which can be used to support the exfoliated graphene, for instance. The formed protein films may be elastic films in some embodiments. In some embodiments, the protein film may even be formed by an ordered network of proteins, and even by means of self-assembly of the proteins. In some embodiments, such an ordered network of proteins is a monolayer, i.e. contains substantially only one layer of proteins. Film-forming property of some hydrophobins and their adhesion to surfaces have been demonstrated in publication Szilvay, G. R.; Paananen, A.; Laurikainen, K.; Vuorimaa, E.; Lemmetyinen, H.; Peltonen, J.; Linder, M. B., Self-assembled hydrophobin protein films at the air-water interface: Structural analysis and molecular engineering, *Biochemistry*, 2007, 46, 2345-2354.

FIG. 1 shows a structure of a HFBI protein that can be used according to an embodiment.

Figure 2:
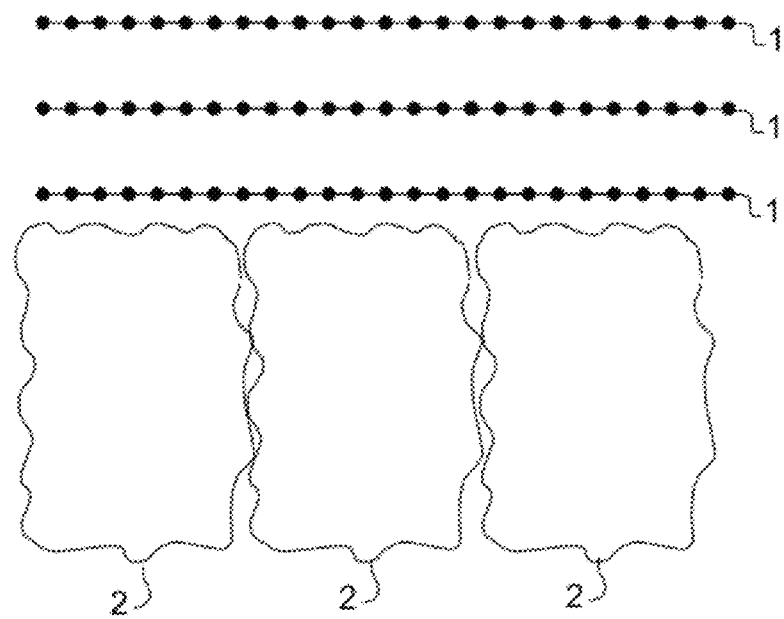
FIG. 2 presents a schematic drawing of proteins adhered on the surface of a graphene layer according to one embodiment.

FIG. 2 is a schematic drawing depicting graphene sheets 1 and proteins 2 adhered on the surface of the outermost graphene sheet 1.

The proteins in embodiments can also include fusion proteins that comprise at least two functional parts. One of the functional parts can be selected such that it has ability to adhere to graphene whereas at least one of the other parts can be selected according to other desired functions. Such other desired functions may relate, for example, to solubility, electrical properties, mechanical properties, chemical properties and/or adhesive properties.

According to an embodiment, at least one of the functional parts in a fusion protein is formed by a hydrophobin or a hydrophobin-like molecule. Examples of such fusion proteins include molecules where some functionality such as solubility, charge, hydrophobicity, chemical reactivity, enzymatic activity, conductivity, or some binding capability has been added to the hydrophobin or hydrophobin like molecule. The addition of this functional group may be performed by chemical coupling, enzymatic modification, post-translational modification, or by using recombinant DNA methods. In a particular embodiment a fusion protein named NCysHFBI can be used. This protein variant contains an added Cys residue, which allows chemical reactions through a sulfhydryl group that it contains.

According to the needs of the application, class I and/or class II hydrophobins can be used. The class I hydrophobins typically form aggregates that are highly insoluble, whereas the aggregates of class II members dissolve more readily. This information can be used when selecting suitable proteins according to the needs of each application. Examples of class II hydrophobins include HFBI, HFBII, and HFBIII that can be obtained from *Trichoderma reesei*.

Other sources of hydrophobins than *Trichoderma* include all filamentous fungi, such as *Schizophyllum, Aspergillus, Fusarium, Cladosporium*, and *Agaricus* species. Examples of additional sources are explained in, for example, the above-referred Linder et al. (FEMS Microbiology reviews, 2005).

In some embodiments, the proteins form a layer on the surface of graphene. By this way, it is possible to produce articles that contain graphene and a protein layer, which can be used, for example, as a support for the graphene. Such articles are called platelets in this document.

The treatment of the surface by proteins may be effected, for example, by preparing a solution containing the proteins and spreading the solution on the surface. The surface can also be immersed in the solution, or otherwise brought into contact with the solution. In one embodiment, the solution is an aqueous solution, and may be purified water or water with added substances to control for example pH or ionic strength. Solvents and non-aqueous components may also be added to the solution.

The surface may be treated by the proteins also without the presence of a solution. For example, it is possible first to prepare a layer of proteins and then bring the surface and the protein layer into contact with each other. Such protein layer can be formed on a surface of a mechanical object, such as a stamp. The protein layer can also be formed at an interface between fluid and fluid, such as at a liquid-liquid, liquid-solid, gas-solid or gas-liquid interface. For example, it is possible first to prepare a solution containing the proteins and then let the proteins assemble at the interface between the solution and the surrounding atmosphere, such as air or selected process gas. Then, the protein layer can be touched with the surface of the graphene or with an intermediate object that is used to transfer the protein layer to the surface of the graphene.

Thus, an embodiment of the method comprises forming a layer of proteins and touching the formed layer of proteins with the surface of the graphene in order to adhere the layer of proteins on the surface. After this, the protein layer with the attached graphene can be pressed against a substrate in order to stamp the graphene on the substrate, if desired. Therefore, it is also possible to accurately place the formed platelets onto a desired target location and therefore to utilize the platelets in electronic applications, for instance.

By means of stamps of other objects it is also possible to provide the platelets with a desired form and thereby to produce desired patterns of graphene. Patterns may be formed also by way of patterning the surface itself from which the graphene is exfoliated.

The above-described methods can be used to manufacture platelets that contain a graphene layer and a protein layer on the surface of the graphene layer. FIGS. 3 to 6 shows schematic drawings depicting cross-sections of such platelets.

Figure 3:
FIG. 3 is a schematic drawing that depicts a cross-section of a platelet according to one embodiment.

Platelet of FIG. 3 consists of a graphene layer 3 and a protein layer 4 on the surface of the graphene layer 3. The graphene layer 3 may comprise a plurality of graphene sheets 1 shown in FIG. 2 or consist of a single graphene sheet 1. The protein layer 4 comprises proteins 2 in at least one layer. Such platelets can be formed, for example, by exfoliation at interfaces as described above.

Figure 4:
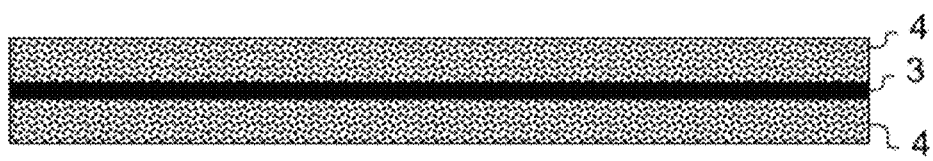
FIG. 4 is a schematic drawing that depicts a cross-section of a platelet according to another embodiment.

Platelet of FIG. 4 comprises a graphene layer 3 and protein layers 4 on the both principal surfaces of the graphene layer 3. In case the protein layers 4 are substantially uniform, the graphene is substantially totally protected by the protein layers 4. However, in some embodiments, the protein layers 4 may also contain holes or voids exposing the graphene layer 3. Such platelets can be produced, for example, by exfoliation in solutions wherein also the other principal surface of the graphene layer 3 becomes in contact with the proteins.

Figure 5:
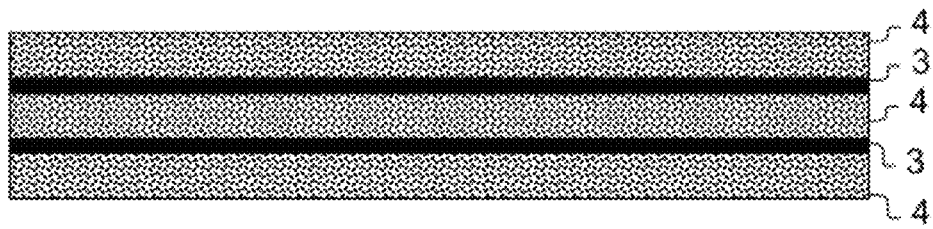
FIG. 5 is a schematic drawing that depicts a cross-section of a platelet according to third embodiment.

Platelet of FIG. 5 comprises a layer structure of a plurality of graphene layers 3 spaced apart and supported by a plurality of protein layers 4. Such platelets can be produced, for example, by using a combination of hydrophobin or hydrophobin-like proteins that have additional functionalities. The additional functionality is chosen so that it forms an interaction with other proteins, for example other hydrophobins or hydrophobin-like proteins that also are bound to graphene sheets. In this way, the proteins associate with each other and form layered structures.

Figure 6:
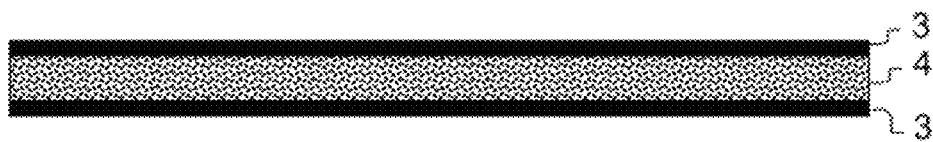
FIG. 6 is a schematic drawing that depicts a cross-section of a platelet according to fourth embodiment.

Platelet of FIG. 6 comprises a protein layer 4 and graphene layers 3 on the both principal surfaces of the protein layer 4. Such platelets can be produced, for example, by combining hydrophobins or hydrophobin-like proteins with additional functionalities so that protein associated graphene form multiple layers. In subsequent stages, the exposed protein layers can be removed.

As understood from the above description, the protein layer 4 does not necessarily cover the graphene layer 3 completely even in the platelets. Thus, in some embodiments, as good coverage as possible is advantageous whereas some other embodiments allow considerable irregularities in the protein layer 4. And as also understood from the above description, coverage is not necessarily important at all in some embodiments of the manufacturing method. This is the case when the proteins are used only to facilitate exfoliation but no support function is needed or desired.

Some embodiments allow irregularities also in the graphene layer 3. Thus, also the graphene layer 3 in a platelet may include variations in thickness and any individual graphene sheet 1 may also comprise a plurality of smaller domains of uniform lattice structure.

In the platelets, the thickness of the graphene layer can be, for example, 1 to 10 graphene sheets 1. Typical thicknesses are believed to be within 1 to 5 graphene sheets 1 in most of the electronics applications, but as already stated, the applications and their requirements are various and the properties of the platelets are selected accordingly.

A special case of the platelet is a platelet wherein the graphene layer 3 consists of a single graphene sheet 1. Such platelets may be produces in any configuration presented in FIGS. 3 to 6.

According to an embodiment, the protein layer 4 includes hydrophobins. Again, a special case is a platelet wherein the protein layer 4 is a monolayer of hydrophobins.

The protein layer 4 may also include fusion proteins, or be formed exclusively by fusion proteins. Furthermore, a single protein layer 4 can include different types of the fusion proteins. In platelets of FIGS. 4 and 5, it is also possible that only one of the protein layers 4 contains fusion proteins.

As the proteins in the protein layers 4, any proteins disclosed above in the context of describing embodiments of the manufacturing methods can be used. Also combinations of the disclosed proteins can be used, either within the single the protein layers 4 or in different protein layers 4 of an individual platelet.

The thickness of a platelet can be less than 50 nanometres, for instance. Thicknesses of individual protein layers 4 may range between 1 to 10 nanometres, for instance.

EXAMPLES

Different methods of exfoliating graphene from graphite by adsorption of proteins have been examined, particularly with hydrophobins. In the experiments, it has been found that the methods can provide a new, efficient way for detaching thin flakes of graphene with thickness varying from 1 to less than 10 graphene sheets even in mild conditions, such as temperatures T<100° C. and near neutral pH.

One of the examined methods comprises forming a stable dispersion of graphene by ultrasonication of graphite in the presence of a wild-type protein or a functional fusion protein, and utilizing the product in nanoelectronical components via self-assembly of the biomolecules that can attach to a substrate material.

Also larger areas of graphene material can be formed by binding multiple layers together via functionality or other interaction between the protein coatings.

Small hydrophobic patch embedded in the hydrophilic body of hydrophobins causes them to self-assemble at interfaces between hydrophilic and hydrophobic materials. The structure of the class II hydrophobin, HFBI, used in one of the examples is presented in FIG. 1. A good example of the interfacial self-assembly is the assembly of HFBI at the interface between water and air, where they have shown to form a crystalline lattice. Besides this amphiphilic behaviour, there is also strong tendency for the hydrophobic patch to bind to solid hydrophobic materials. Thus, the layer of hydrophobins used in this example can be transferred and bound on a substrate, if desired. Another property that makes hydrophobin particularly interesting is the strong lateral interaction between the proteins as the interfacial monolayer forms. The strong monolayer membrane of HFBI, which can be only few nanometers in thickness, has been proposed as a potential material in electronics and has shown interesting behaviour when coupled with the conventional materials used in electronics.

The interaction between hydrophobins and hydrophobic surfaces has been studied both on macroscopic, microscopic and even on nanoscopic surfaces. Although the crystallinity of the protein layer has not been verified in every case, the evidence of selective binding to hydrophobic surfaces was clear. In the experiments, the self-assembly of hydrophobins has been expanded as two-dimensional material having surface area at a microscopic level and thickness on nanoscale.

Based on some of the tests, it was considered that the extreme change in wettability of hydrophobic materials, such as graphite, after the treatment with hydrophobins would have been one of the key factors leading to exfoliation of graphene. In earlier attempts to exfoliate graphene from graphite in solutions, the surface energy of graphene-water interface has been lowered by means of solvents or by adding a surfactant to the system as a third phase and thus facilitating the dispersion of graphene sheets to the solution. However, it is believed that the formation of highly ordered protein crystal at the surface of graphene flakes can stable the dispersions further.

Besides stabilization of the exfoliated flakes, the separation of the flakes is considered to play a role in exfoliation of graphene. Yet the exact mechanism is not know, it is probable that the relatively small size of hydrophobin molecules and its high affinity towards graphite surface are also relevant factors. The energetic benefit of having a hydrophilic protein layer on the graphene surface is surprisingly high, because it has been demonstrated to exceed the stacking of graphene sheets in graphite. The exfoliation of graphene was facilitated by ultrasonication, which has been believed to destroy the graphene sheets. However, in our experiments, graphene appears in pieces of several square micrometers, which is sufficiently large for components for electronic devices.

Figure 7:
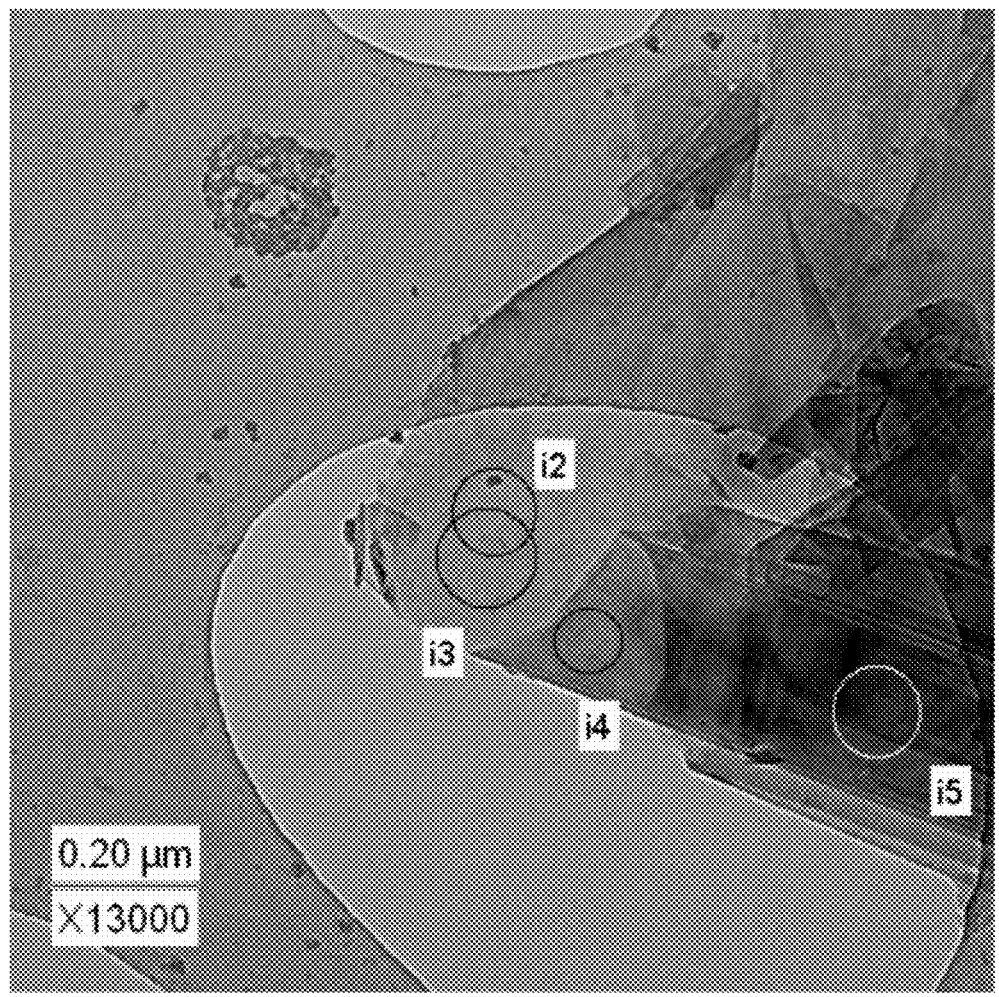
FIG. 7 shows a TEM image of a piece of graphene according to an embodiment.
Figure 8:
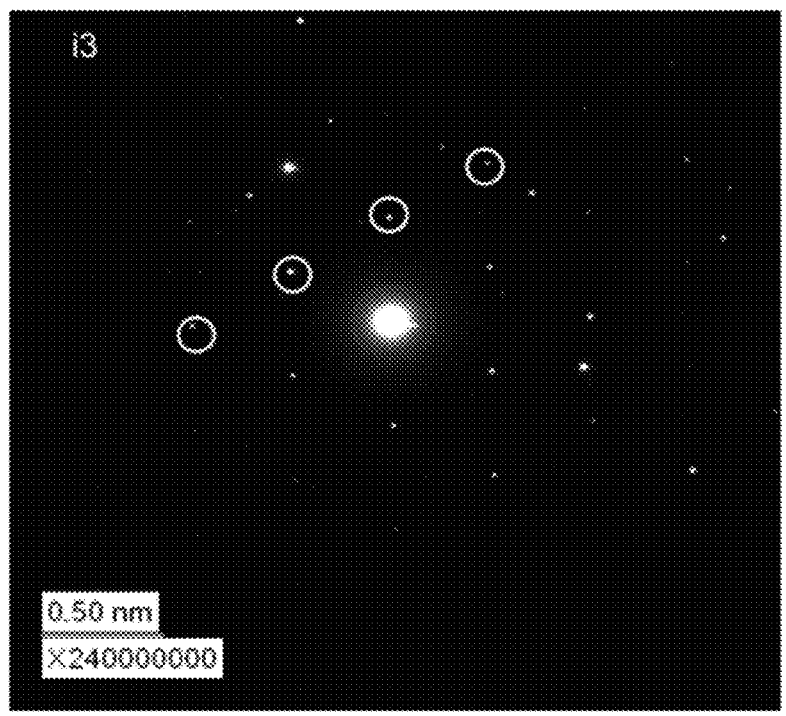
FIG. 8 shows a diffraction pattern measured from the graphene piece of FIG. 7.
Figure 9:
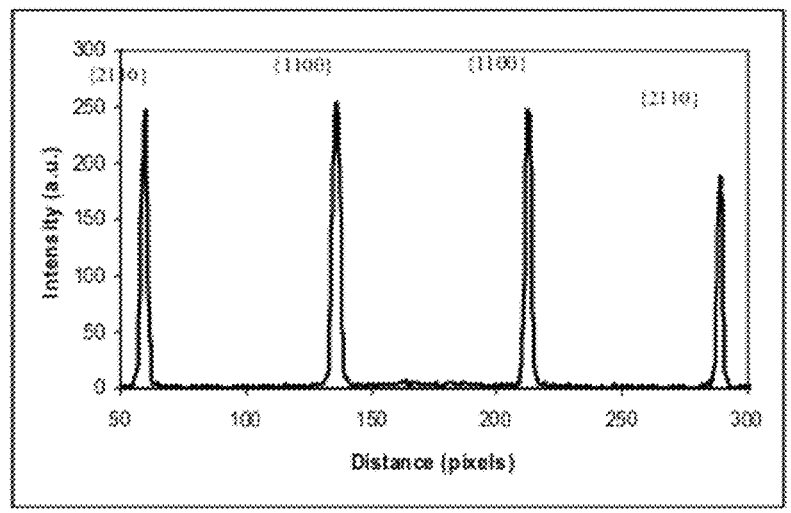
FIG. 9 presents intensities of the diffraction peaks measured from the graphene piece of FIG. 7.

Example of FIGS. 7 to 9

Exfoliation of graphene was carried out by exposing a 0.5-1.0 ml solution containing a small piece (<1 mg) of highly oriented pyrolytic graphite (HOPG) of highest quality (ZYA grade, domain size up to 10 $\mu m^2$) or Kish graphite, 0.02-0.026 mM protein (HFBI wildtype or a fusion protein NCysHFBI) in 10 mM sodium phosphate buffer at pH 8 or pure deionized water to ultrasonic waves in a tip sonicator. Amplitude of the probe was set to 26 micrometers. Temperature of the solution was controlled by keeping the sample in an ice bath during the sonication. The sample was exposed to sonication for total time of 10 minutes, but small pauses in sonication were kept at approximately one minute intervals to prevent the solution from boiling. Thus, the sonication temperature maintained between 0 and 100° C. After sonication, the sample was centrifuged for 15 minutes at 500 rpm to facilitate sedimentation of the heavier pieces of graphite. The supernatant was used in the further analyses.

The sequences of the HFBI and NCysHFBI used in the examples are as follows:

```
NCysHFBI
SCPATTTGSSPGPSNGNGNVCPPGLFSNPQCCATQVLGLIGLDCKVPSQN

VYDGTDFRNVCAKTGAQPLCCVAPVAGQALLCQTAVGA

HFBI
SNGNGNVCPPGLFSNPQCCATQVLGLIGLDCKVPSQNVYDGTDFRNVCAK

TGAQPLCCVAPVAGQALLCQTAVGA
```

Samples of graphene sheets for transmission electron microscopy (TEM) were prepared by pipetting 2×20 microliters of the fresh supernatant on a holey carbon grid. TEM image of a piece of graphene sheet is shown in FIG. 7. The sample was kept on top of a filter paper to allow the absorption of the excess solution to the filter. An example of a graphene layer and diffraction patterns measured from different parts of it is shown in FIG. 8. Electron diffraction patterns measured at different spots of a large folded piece of graphene shows evidence of single layered graphene sheets. FIG. 9 presents the intensities of the diffraction peaks measured at spot i3 that show the peaks that can be labelled with Miller-Bravais indices {1100} and {2110}. The ratio between intensities of the peaks {1100} and {2110} have values larger to 1, which according to calculations, corresponds to the diffraction of electrons from a single sheet of graphene. Pieces on the same size range and similar properties were found all over the samples indicating to an effective method for graphene exfoliation. Also pieces consisting of multilayered graphene and graphite were present in some extent.

By choosing a functional fusion protein comprising a hydrophobin part and another part having a functional group possessing the ability for biomolecular recognition or other binding, it is possible to assemble the graphene sheets on a surface having affinity to the chosen functionality. By this method, it is possible to utilize self-assembly of the chosen function for directing the graphene sheets on a patterned substrate, for instance.

Figure 10:
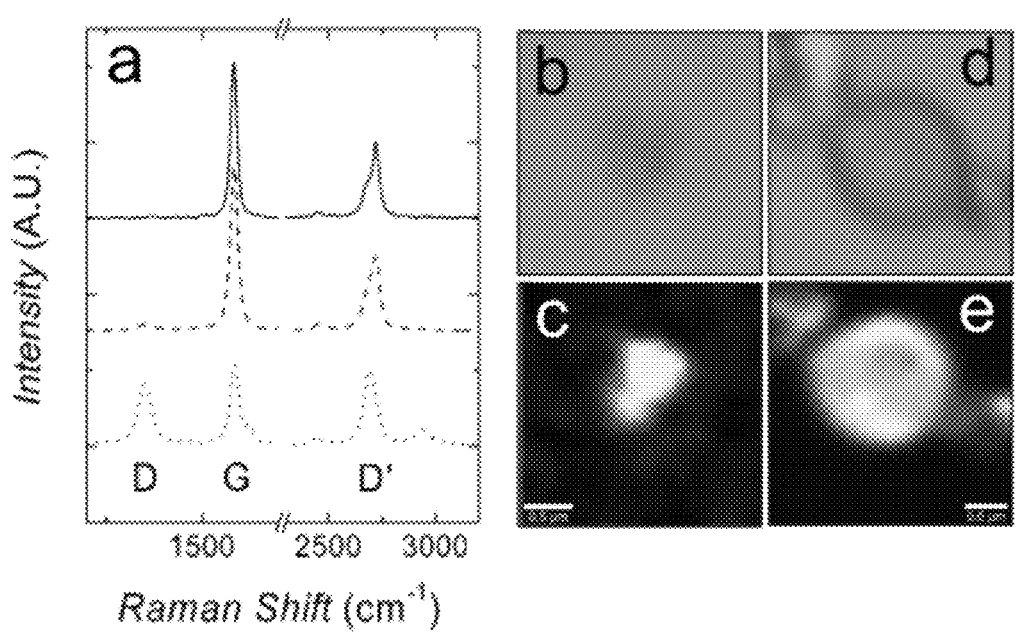
FIG. 10 shows protein exfoliated graphene flakes and HOPG pillars in one experiment.

Example of FIG. 10

Exfoliation of graphene from Kish graphite and HOPG pillars was also tested by experiments. Exfoliation of graphene and thin graphite sheets was carried out by exposing pieces of graphite and hydrophobin proteins to ultrasonic waves in an ultrasonic bath (Branson, Bransonic 1510, freq 40 kHz) in aqueous solution for 40 minutes. The proteins used were the wild type HFBI and its fusions (NCysHBFI)$_2$ dimer and HFBI-ZE. Exfoliation was carried out in 0.3-1 ml volumes of protein dissolved in mQ water (Millipore) as 1.0 to 3 mg/ml solutions. Chemically purified Kish graphite was applied as granules that were immersed in protein solution and treated as described above. Lithographically worked wafer made from HOPG was immersed in the solution as a platelet containing micro pillars and the supporting graphite wafer and sonicated in the ultrasonic bath.

After exfoliation, the excess protein was removed from the solution by centrifugation of the exfoliated material. Larger pieces of graphite that were not affected by the treatment were first separated from the dispersed material by a gentle centrifugation with a mini centrifuge (National Labnet Co., Mini centrifuge C-1200). After this, the supernatant was centrifuged at room temperature with 14 000 rpm (Eppendorf, Centrifuge 5417R) for 5 minutes after which the solution was replaced with fresh mQ water. This washing was repeated for three times.

HOPG micropillars were prepared from highly organized pyrolythic graphite (HOPG) (SPI supplier, SPI-1 grade) that was attached after cutting on small pieces to a Si substrate with a silver epoxy. A 120 nm thick layer of PECVD $Si_3N_4$ was deposited at 200° C. Optical lithography with a negative resist (Micro Resist Technology, ma-N 1410) and development (ma-D 533 s) was followed by wet etching of the nitride layer with a BHF solution. The resist mask was removed with acetone and isopropanol. The remained $Si_3N_4$ structures served as a hard mask during the $O_2$ ICP etch patterning of the HOPG. Finally the nitride mask was removed in buffered HF solution.

Then, the samples were prepared for Raman studies. First, pH of the exfoliated graphene solution was adjusted by adding 10 mM MacIlvane buffer having pH 3. Pieces of oxidized silicon wafers were immersed in to the solution for 17 h, during which the small flakes of graphene were attached to the silicon oxide due to opposite charges. The surfaces were rinsed with mQ water and dried with nitrogen before Raman measurements.

After these steps, the samples were measured by Raman measurements. FIG. 10 shows comparisons of Raman signals from different graphitic materials. FIG. 10a depicts Raman shift spectra measured from HOPG (solid line), a thin exfoliated HOPG micropillar (dashed line) and exfoliated graphene flake (dotted line). The linear background has been subtracted from all spectra, and the spectra have been normalized according to the intensity of the D' peak.

FIG. 10b is an optical microscope image of an exfoliated graphene flake and FIG. 10c is an intensity map of the D' peak measured from the same graphene flake. FIG. 10d is an optical microscope image of an exfoliated HOPG pillar and FIG. 10e is an intensity map of the D' peak measured from the same pillar.

In the example of FIGS. 10, the protein exfoliated graphene flakes and HOPG pillars were immobilized on a Si wafer with a 90 nm thick $SiO_2$ surface for Raman measurements on a confocal Raman microscope with a 532 nm laser. Area scans around the flakes were performed to analyze the size and composition of the flakes in question. Peak fitting was done to selected spectra and the classification of the graphene flakes was done based on the composition of the graphene D' peak and the intensity ratios of the graphene D' peak and G peak in the Raman shift spectrum (for more information, see: Graf D, et at (2007) Spatially resolved Raman spectroscopy of single- and few-layer graphene. *Nano Lett* 7: 238-242).

Graphene sheets of different thicknesses have special fingerprints in their Raman spectrum that reveal the number of layers in a particular flake (for more information, see: Ferrari AC, et at (2006) Raman spectrum of graphene and graphene layers. *Phys Rev Lett* 97: 187401/1-187401/4). FIG. 10 shows a comparison of Raman spectra of bulk graphite and graphene samples of different thicknesses. The samples are: highly oriented pyrolytic graphite (HOPG), a protein-exfoliated graphene sheet and a protein-exfoliated HOPG micropillar consisting of several layers of graphene. FIG. 10b shows the optical images and Raman intensity plot of the graphene spectrum D' peak for the exfoliated graphene flake and the exfoliated thin HOPG micropillar. The HOPG micropillar has characteristics similar to those of HOPG in the Raman spectra. The Raman spectrum of the exfoliated small flake is more similar to the Raman spectrum of graphene than graphite. The number of graphene layers in the thinnest exfoliated graphene sample was determined from the Raman spectra by comparing the relative intensities of the G and D' peak and the position of the G peak. The results show that the observed graphene flake is either a bilayer or a monolayer of graphene.

Electronic Devices

Figure 11:
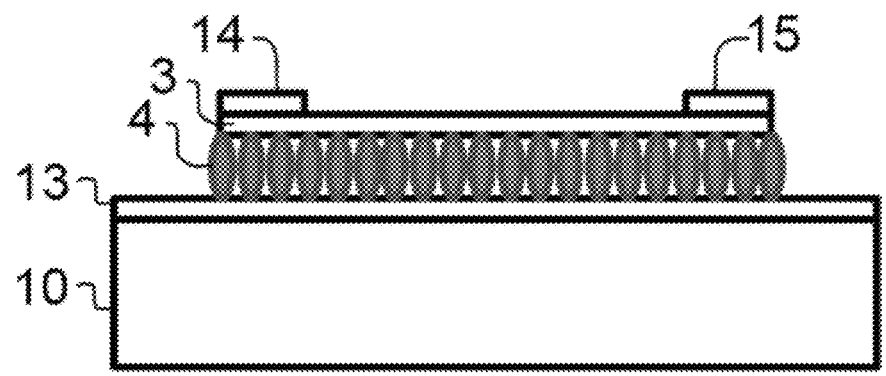
FIG. 11 presents a schematic cross-section of an electronic device according to an embodiment.
Figure 12:
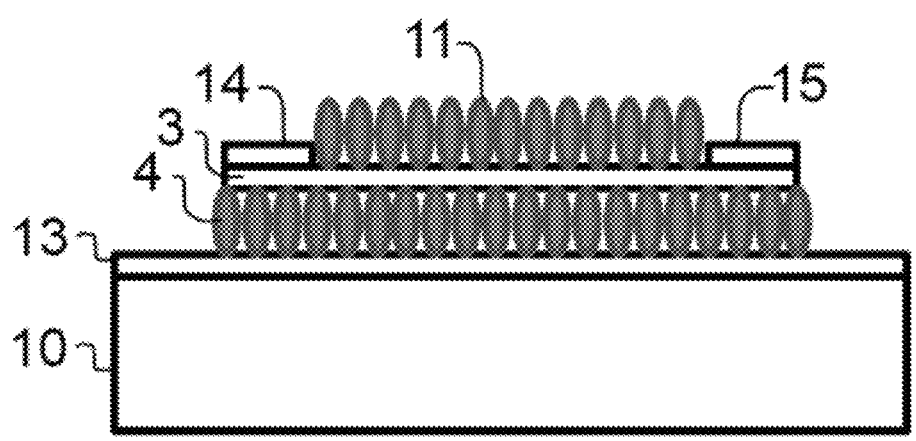
FIG. 12 presents a schematic cross-section of an electronic device according to another embodiment.
Figure 13:
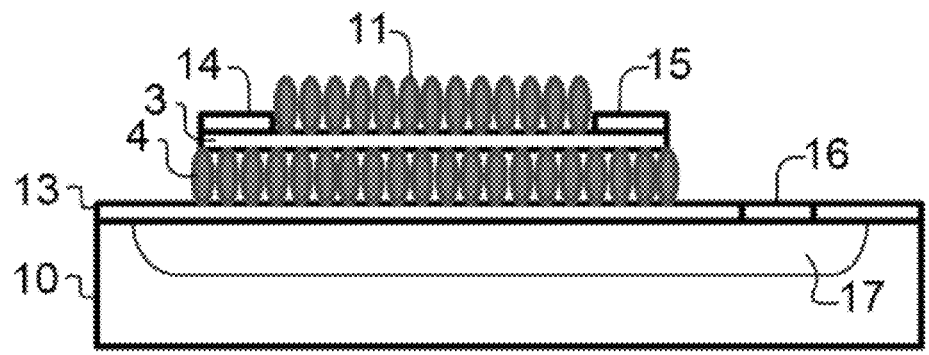
FIG. 13 presents a schematic cross-section of an electronic device according to a further embodiment.

The above described platelets can be utilized in electronic devices and sensors in various ways. FIGS. 11 to 13 show three such embodiments.

FIG. 11 is a schematic cross-section of a BioFET according to an embodiment. The device of FIG. 11 has been prepared on a substrate 10, which can be a silicon substrate, for instance. In the embodiment of FIG. 11, the substrate 10 is a p-type substrate. The device of FIG. 11 also comprises a dielectric layer 13, which can be $SiO_2$, for instance. The dielectric layer 13 can be selected such that it provides good adhesion with the platelets. On the surface of the dielectric layer 13, the device comprises a platelet, such as the platelet of FIG. 3. Thus, there is a protein layer 4 on the surface of the dielectric layer 13 and a graphene layer of the surface of the protein layer 4. Such a structure can be made, for example, by forming the protein layer 4 on a surface of graphite stamp or other surface containing graphene, and thereafter stamping or transferring the protein layer 4 together with the graphene layer 3 on the surface of the protein layer 4 to the desired site, utilizing the techniques described above. The desired site is here the surface of the dielectric layer 13 at a specified location, which may be called target area. In the device of FIG. 11, the graphene layer 3 forms a channel of the BioFET. The channel is connected to a source electrode 14 and a drain electrode 15 that can be made of a suitable metal, for example by evaporation.

The device of FIG. 12 is based on the device of FIG. 11 but has a further layer of functionalized proteins 11 on the surface of the graphene layer 3. Such a layer of functionalized proteins 11 can be made, for example, by immersing the device in a suitable solution, as described above. The device of FIG. 12 can be suitably biased by means of a bias voltage connected to the substrate 10. Then, the current in the channel is sensitive to polarization state of the layer of functionalized proteins 11 on the surface of the graphene layer 3, or other changes in the charge within the layer of functionalized proteins 11.

FIG. 13 is a schematic cross-section of a BioFET according to an embodiment, wherein the structure of FIG. 12 has been made on the surface of a substrate 10, which has a p-type well 17 prepared in a non-doped or a weakly n-type silicon substrate at the location of the device. The device of FIG. 13 also comprises gate electrode 16 connected to the well 17. The gate electrode 16 can be made of a suitable metal, by evaporation, for instance.

Therefore, the above-described embodiments and examples provide considerable benefits. For example, it is possible to construct a quick one-step method for graphene exfoliation. Furthermore, embodiments provide safe methods as no strong chemicals or high temperatures are needed. Embodiments allow safe and easy handling of the material in solution dispersions as no hazardous nanopowders are necessary either. There are also embodiments allowing functionalization of graphene without disturbing the electronic structure and properties. For such embodiments, a wide variety of functionalities are available. Furthermore, there are embodiments allowing combination of biomolecular recognition and silicon technology. It is also possible to create an interface between biological and electrical materials and, by means of some embodiments, also build devices even utilizing by self-assembly of proteins at desired locations.

The above description is only to exemplify the invention and is not intended to limit the scope of protection offered by the claims. The claims are also intended to cover the equivalents thereof and not to be construed literally.

The invention claimed is:

1. A method of producing graphene-containing platelets by exfoliating a graphene layer from a surface, the method comprising facilitating exfoliation by adhering proteins to the surface and applying a force to the proteins such that the proteins deliver the force to the surface, thereby separating the graphene layer from the surface.

2. The method of claim 1, wherein the proteins include amphiphilic proteins.

3. The method of claim 1, wherein the proteins include hydrophobins.

4. The method of claim 1, wherein the proteins include fusion proteins comprising at least two functional parts such that at least one of the functional parts is formed by a hydrophobin.

5. The method of claim 3, wherein the hydrophobins are class II hydrophobins.

6. The method of claim 3, wherein the hydrophobins are from *Trichoderma reesei*.

7. The method of claim 3, wherein the proteins include at least one of:
an HFBI and a fusion protein NCysHFBI.

8. The method of claim 1, wherein the proteins form a layer on the surface.

9. The method of claim 1, wherein said treatment comprises immersing the surface in a solution containing the proteins.

10. The method of claim 1, wherein said treatment comprises:
forming a layer of said proteins,
touching the formed layer of proteins with the surface in order to adhere the layer of proteins on the surface, and
pressing the layer of proteins on the surface against a substrate in order to stamp the graphene on the substrate.

11. The method of claim 1, comprising exposing the surface to ultrasonic waves in order to facilitate exfoliation.

12. The method of claim 1, wherein the surface is a surface of a highly oriented graphite body.

13. The method of claim 1, wherein the surface contains patterned features in order to produce platelets with predetermined shape.

14. The method of claim 1, wherein the proteins include a plurality of proteins each having a hydrophobic part that is capable of adhering to graphene.

15. The method of claim 1, wherein the proteins include a plurality of proteins capable of adhering to each other in order to form a network of proteins.

16. A method of producing graphene-containing platelets by exfoliating a graphene layer from a surface, the method comprising facilitating exfoliation by adhering proteins to the surface and applying a force to the proteins such that the proteins deliver the force to the surface, thereby separating the graphene layer from the surface, said proteins including hydrophobins.

17. A method of producing graphene-containing platelets by exfoliating a graphene layer from a surface of a highly oriented graphite body, the method comprising facilitating exfoliation by adhering proteins to the surface and applying a force to the proteins such that the proteins deliver the force to the surface, thereby separating the graphene layer from the surface.

18. The method of claim 17, wherein said proteins include hydrophobins.

19. The method of claim 18, wherein the hydrophobins are class II hydrophobins.

20. The method of claim 18, wherein the hydrophobins are from *Trichoderma reesei*.

21. The method of claim 17, wherein the proteins form a layer on the surface of the graphene layer.

22. The method of claim 1, wherein the exfoliation occurs at a temperature less than 100° C.

23. The method of claim 1, wherein the force is induced by acoustic energy, mechanical energy, or a combination thereof.

* * * * *